(12) United States Patent
Lee et al.

(10) Patent No.: US 9,526,177 B2
(45) Date of Patent: Dec. 20, 2016

(54) PRINTED CIRCUIT BOARD INCLUDING ELECTRONIC COMPONENT EMBEDDED THEREIN AND METHOD FOR MANUFACTURING THE SAME

(71) Applicant: Samsung Electro-Mechanics Co., Ltd., Suwon (KR)

(72) Inventors: Seung Eun Lee, Sungnam (KR); Yul Kyo Chung, Yongin (KR); Yee Na Shin, Suwon (KR); Doo Hwan Lee, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 543 days.

(21) Appl. No.: 14/061,047

(22) Filed: Oct. 23, 2013

(65) Prior Publication Data

US 2014/0321084 A1 Oct. 30, 2014

(30) Foreign Application Priority Data

Apr. 26, 2013 (KR) ........................ 10-2013-0046733

(51) Int. Cl.
*H05K 1/16* (2006.01)
*H05K 1/18* (2006.01)
(Continued)

(52) U.S. Cl.
CPC .............. *H05K 1/185* (2013.01); *H01L 24/19* (2013.01); *H01L 24/20* (2013.01); *H01L 21/568* (2013.01);
(Continued)

(58) Field of Classification Search
CPC .......... H05K 1/18; H05K 1/185; H05K 1/181;
H05K 1/182; H05K 1/184; H05K 2201/09854; H05K 2201/10613; H05K 2201/10636; H05K 3/4602; H05K 2203/1469; H01L 21/50; H01L 21/52; H01L 21/56; H01L 21/568; H01L 2224/04105; H01L 24/19; H01L 24/20; H01L 2924/12042; Y10T 29/49139; Y02P 70/611
(Continued)

(56) References Cited

U.S. PATENT DOCUMENTS

| | | | | |
|---|---|---|---|---|
| 7,653,991 B2* | 2/2010 | Mok | ...................... | H05K 1/188 174/262 |
| 8,780,572 B2* | 7/2014 | Lee | ...................... | H05K 1/185 174/260 |
| 9,024,203 B2* | 5/2015 | Lai | ...................... | H05K 1/184 174/260 |

FOREIGN PATENT DOCUMENTS

| | | |
|---|---|---|
| JP | 2009-105344 | 5/2009 |
| KR | 10-1107067 | 1/2012 |

(Continued)

*Primary Examiner* — Angel R Estrada
(74) *Attorney, Agent, or Firm* — NSIP Law

(57) ABSTRACT

Disclosed herein are a printed circuit board including an electronic component embedded therein and a method for manufacturing the same. The printed circuit board including an electronic component embedded therein includes: a core formed with a cavity which is formed of a through hole and has a side wall formed with an inclined surface having a top and bottom symmetrically formed based on a central portion thereof; an electronic component embedded in the cavity; insulating layers stacked on upper and lower portions of the core including the electronic component; and external circuit layers formed on the insulating layers.

10 Claims, 4 Drawing Sheets

(51) Int. Cl.
*H01L 23/00* (2006.01)
*H05K 3/46* (2006.01)
*H01L 21/56* (2006.01)

(52) U.S. Cl.
CPC ............... *H01L 2224/04105* (2013.01); *H01L 2924/12042* (2013.01); *H05K 3/4602* (2013.01); *H05K 2201/09854* (2013.01); *H05K 2201/10636* (2013.01); *H05K 2203/1469* (2013.01); *Y02P 70/611* (2015.11); *Y10T 29/49139* (2015.01)

(58) Field of Classification Search
USPC ........ 174/260, 261, 265, 262; 361/761, 762, 361/767, 810, 820
See application file for complete search history.

(56) References Cited

FOREIGN PATENT DOCUMENTS

| | | |
|---|---|---|
| KR | 10-2013-0035981 | 4/2013 |
| WO | WO 2013/008552 A1 | 1/2013 |

\* cited by examiner

PRINTED CIRCUIT BOARD INCLUDING ELECTRONIC COMPONENT EMBEDDED THEREIN AND METHOD FOR MANUFACTURING THE SAME

This application claims the benefit under 35 U.S.C. Section 119 of Korean Patent Application Serial No. 10-2013-0046733 entitled "Printed Circuit Board Including Electronic Component Embedded Therein And Method For Manufacturing The Same" filed on Apr. 26, 2013, which is hereby incorporated by reference in its entirety into this application.

BACKGROUND OF THE INVENTION

1. Technical Field

The present invention relates to a printed circuit board including an electronic component embedded therein and a method for manufacturing the same.

2. Description of the Related Art

As electronic devices, such as cellular phones, IT devices, and the like, are small and light, there is a need to mount electronic components on a restricted area of a board to help the electronic devices perform more functions.

However, as the size of the board is restricted, a mounting area of electronic components may not be sufficiently secured. Therefore, a need exists for a technology of embedding electronic components, such as active devices of an IC, a semiconductor chip, etc., passive devices, and the like, on a board. Recently, a technology of embedding or stacking the active devices and the passive devices in or on the same layer has been developed.

In general, a method for manufacturing a printed circuit board including components embedded therein simply includes forming a cavity in a core thereof and embedding various devices and electronic components of an IC, a semiconductor chip, etc., in the cavity. Next, the electronic components may be fixed and an insulating layer may be formed, by applying a resin material, such as prepreg, and the like, in the cavity and on the core having an electronic component embedded therein and the electronic component may be electrically conducted with outside of the board by forming a via hole or a through hole on the insulating layer and forming circuits by plating.

In this case, a circuit pattern is formed in and on the via hole or the through hole by the plating and is connected as an electrical connection means with the electronic component embedded in the board. Meanwhile, a multi-layer printed circuit board including an electronic component embedded therein may be manufactured by sequentially stacking the insulating layers on upper and lower surfaces of the board.

As such, the printed circuit board including an electronic component embedded therein according to the related art uses a core and a build up material having a low coefficient of thermal expansion (CTE) so as to minimize warpage of the board. Further, there is a need to make a thickness of the core thick so as to reduce the occurrence of warpage of the board, which makes it difficult to maximize flowability of resin leaked from the buildup material in the space within the cavity of the core.

In addition, the printed circuit board including an electronic component embedded therein according to the related art needs to use the core and the build up material having low CTE in order to minimize the warpage of the board. As the CTE decreases, the filler content increases, such that adhesion may be degraded.

Further, since a width of the cavity having an electronic component embedded therein is reduced according to a fine pitch of the pattern formed on the printed circuit board, an interval between a side wall of the cavity and the electronic component and when the electronic component is biased to one side within the cavity, electrode patterns formed on the core contacts external electrodes of the electronic component, which leads to a short circuit.

RELATED ART DOCUMENT

Patent Document (Patent Document 1) Japanese Patent Laid-open Publication No. 2009-105344

SUMMARY OF THE INVENTION

An object of the present invention is to provide a printed circuit board including an electronic component embedded therein, in which a side wall of a core is formed with an inclined surface which has a top and a bottom symmetrically formed.

Another object of the present invention is to provide a method for manufacturing a printed circuit board including an electronic component embedded therein, which prevents a lamination of a stacked member to improve reliability and yield of a product.

According to an exemplary embodiment of the present invention, there is provided a printed circuit board including an electronic component embedded therein, including: a core formed with a cavity which is formed of a through hole and has a side wall formed with an inclined surface having a top and a bottom symmetrically formed based on a central portion thereof; an electronic component embedded in the cavity; insulating layers stacked on upper and lower portions of the core including the electronic component; and external circuit layers formed on the insulating layers.

The core may have the inclined surface forming an acute angle a formed on the upper and lower portions thereof based on the central portion thereof.

The cavity may be formed to have a width equal to or larger than that of the electronic component based on a corner of a protruded part formed at a central portion of the side wall.

The core may have internal circuit layers formed on upper and lower surfaces thereof, respectively, and one side of the internal circuit layer formed at an adjacent position to the cavity of the internal circuit layers may coincide with a point at which an inclined surface of the cavity starts.

An inclined surface of the cavity may be formed with a micro roughness Ra ranging from 0.05 to 2 μm along the inclined surface thereof.

The insulating layer may be further formed with a via through which the external circuit layers are electrically connected to the external electrodes and the insulating layer may fill a space between the cavity and the electronic component.

DESCRIPTION OF THE PREFERRED EMBODIMENTS

The acting effects and technical configuration with respect to the objects of a printed circuit board including an electronic component embedded therein and a method for manufacturing the same according to the present invention will be clearly understood by the following description in which exemplary embodiments of the present invention are described with reference to the accompanying drawings.

Figure 1:
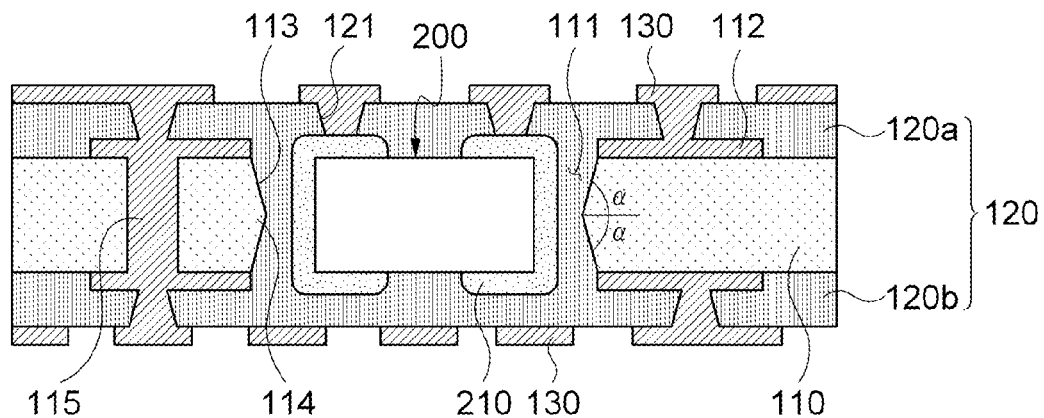
FIG. 1 is a cross-sectional view of a printed circuit board including an electronic component embedded therein according to an exemplary embodiment of the present invention.

First, FIG. 1 is a cross-sectional view of a printed circuit board including an electronic component embedded therein according to an exemplary embodiment of the present invention.

As illustrated in FIG. 1, a printed circuit board 100 including an electronic component embedded therein according to an exemplary embodiment of the present invention may include a core 110 in which a cavity 111 is formed, an electronic component 200 embedded in the cavity 111, an insulating layer 120 stacked on upper and lower portions of the core 110 including the electronic component 200, and external circuit layers 130 formed on the insulating layer 120.

In the printed circuit board 100 including an electronic component embedded therein, the exemplary embodiment of the present invention illustrates that the electronic component 200 embedded in the core 110 is embedded in one place, but is not limited thereto. Therefore, the electronic component 200 may be embedded in every printed circuit board as a unit at a predetermined interval and at least one electronic component 200 may be embedded depending on a kind of embedded components.

The cavity 111 may be formed in the core 110 disposed at a central portion of the printed circuit board 100 including an electronic component embedded therein in a form of a through hole, the cavity 111 may be formed by laser machining or drilling machining using CNC, and a side wall of the cavity 111 may be formed with an inclined surface 113 which has a top and bottom symmetrically formed. That is, the inclined surface 113 forming an acute angle a may be formed on upper and lower portions of the core 110, based on a central portion of the core 110. Therefore, both sides within the cavity 111 may be formed in a hourglass form in which a central portion of the cavity 111 protrudes inwardly.

In this case, the cavity 111 may have a width equal to or larger than that of the electronic component 200, based on a corner of a protruded part 114 of the central portion thereof protruding from the side wall thereof.

Internal circuit layers 112 may be formed on the upper and lower portions of the core 110 in a predetermined pattern. One side of the internal circuit layer 112 formed at a position adjacent to the cavity 111 of the internal circuit layers 112 may coincide with a point at which the inclined surface 113 starts from the upper and lower portions of the core 110. In this case, the internal circuit layer 112 adjacent to the cavity 111 is used as a mask at the time of forming the inclined side wall of the cavity 111 so that the cavity 111 suffers from the laser machining based on one side of the internal circuit layer 112, thereby easily forming the inclined surface 113 based on the central portion of the core 110. Further, the internal circuit layers 112 may be electrically connected with each other through a via hole or a through hole 115 which penetrates through the core 110.

Meanwhile, the inclined surface 113 formed on the side wall of the cavity 111 formed in the core 110 may be formed with micro roughness Ra ranging from 0.05 to 2 μm along the inclined side wall thereof. Bonding performance with a resin filled in the cavity 111 may be improved by the micro roughness formed on the inclined surface 113 of the cavity 111, thereby preventing a lamination between the inclined surface 113 of the cavity 111 and the resin eluted and hardened from an insulating layer to be described below.

In this case, the roughness formed on the side wall of the cavity 111 of the core 110 may be formed by physical methods, such as sandblast, and the like and chemical methods, such as hydrofluoric acid treatment, and the like. Since the core 110 in which the cavity 111 is formed includes a glass fabric formed therein, it is difficult to form the roughness on a glass surface using a general desmear treatment and therefore, it is preferable to form the roughness by the sandblast or the hydrofluoric acid treatment.

The cavity 111 of the core 110 has the electronic component 200 embedded therein. As the electronic components 200, passive devices, such as MLCC, LTCC, and the like, and active devices, such as an IC, a semiconductor chip, a CPU, and the like, may be used. In this case, a height of the electronic component may be formed to be equal to that of the core.

Herein, when the MLCC having a form as illustrated in the drawings will be described as an example of the electronic component 200, the electronic component 200 may include a body 201 formed with the internal electrode and external electrodes 202 of an anode and a cathode formed at both sides of the body 201, in which the external electrodes 202 formed at both sides each may be physically and electrically connected to the external circuit layer formed on the insulating layer to be described below.

Figure 3:
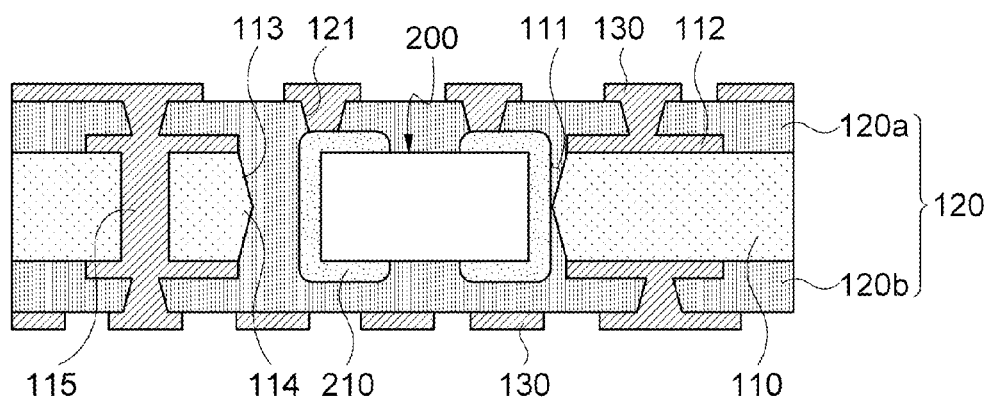
FIG. 3 is a cross-sectional view of a state in which an embedded position of an electronic component in the printed circuit board including an electronic component embedded therein illustrated in FIG. 1 is biased.

As illustrated in FIG. 3, the electronic component 200 embedded in the cavity 111 of the core 110 may be embedded to be biased to one side within the cavity 111. In this case, the electronic component 200 may be embedded in a position at which the electronic component is biased to one side within the cavity 111 during the embedding of the electronic component 200 in the cavity 111 and may be embedded to be biased to one side within the cavity 111 during the hardening of an insulating material at the time of forming the insulating layer.

When the electronic component 200 is embedded to be biased to one side within the cavity 111, the external electrode 210 of one side of the external electrodes 210 at both sides of the electronic component 200 may contact the corner of the protruded part 114 formed on the side wall of the cavity 111 to prevent the contact with the internal circuit layer 112 formed on the core 110, thereby fundamentally preventing the short circuit between the internal circuit layer 112 and the external electrode 210.

The insulating layer 120 may be formed on the upper and lower portions of the core 110 including the electronic component 200 embedded therein, respectively. The insulating layer 120 may be formed by stacking and hardening the insulating material, that is, an insulating resin material, such as prepreg. When the resin included in the prepreg is introduced into a space between the cavity 111 and the electronic component 200 during the hardening of the insulating layer 120 on the upper and lower portions of the core 110 by thermo-compression, the resin is introduced along the inclined surface 113 formed in the cavity 111 of the core 110, thereby improving the flowability of the resin within the core 110.

The insulating layer 120 may be formed with a plurality of vias 121. Like the cavity 111 formed in the core 110, the via 121 may be formed by the laser machining and after the via 121 is machined, a plating layer may be formed on the upper surface of the insulating layer 120 including the via and may be etched to form the external circuit layer 130 electrically connected to the electronic component 200.

Method for Manufacturing Printed Circuit Board Including Electronic Component Embedded Therein A method for manufacturing a printed circuit board including an electronic component embedded therein according to the exemplary embodiment of the present invention configured as described above will be described below.

Figure 2A:
FIGS. 2A to 2J are cross-sectional views of a method for manufacturing a printed circuit board including an electronic component embedded therein according to another exemplary embodiment of the present invention.

FIGS. 2A to 2J are flow charts of a method for manufacturing a printed circuit board including an electronic component embedded therein according to the exemplary embodiment of the present invention. First, as illustrated in FIG. 2A, the core 110 is prepared. The core 110 is an insulating material in which glass fabric is impregnated and may have a thickness equal to or thicker than that of the electronic component embedded therein. In this case, as the electronic component embedded in the core 110 the MLCC may be used. Further, as the core 110, a copper clad laminate (CCL) having a copper clad layer formed on both sides thereof in addition to a plate-shaped insulating material may be used.

Figure 2B:
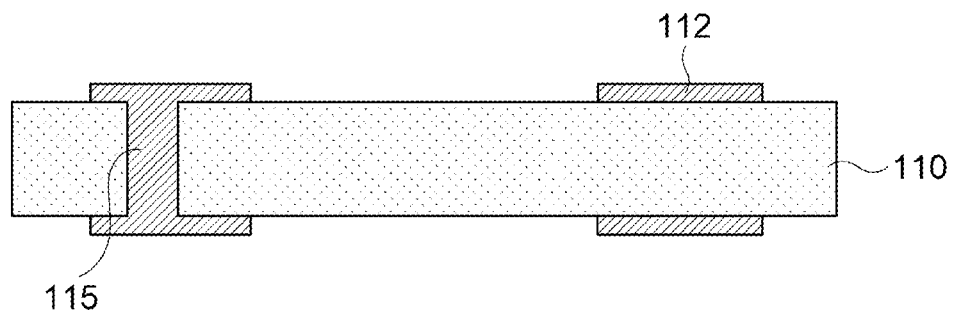

The core 110 forms a reference hole or a through hole 115 as illustrated in FIG. 2B, the plating layers are formed on the upper and lower surfaces of the core, and patterning is performed by etching the plating layer to form the internal circuit layer 112. The internal circuit layer 112 may be formed by tenting, MSAP, and SAP methods.

Figure 2C:
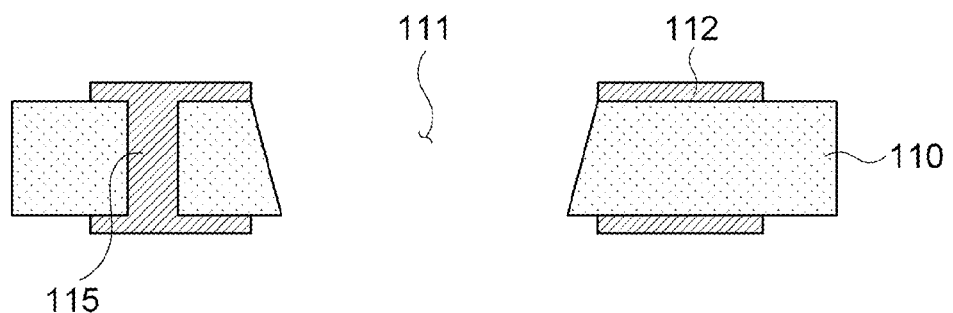
Figure 2D:
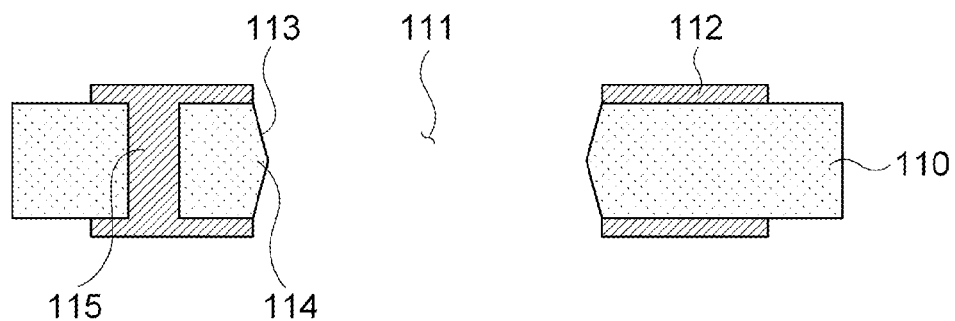

Next, as illustrated in FIGS. 2C and 2D, the cavity 111 is formed on the core 110. The cavity 111 may be formed based on the internal circuit layers 112 formed on both surfaces of the core 110. In this case, the side wall of the cavity 111 may be provide with the inclined surface 113 which has the top and bottom symmetrically formed based on the central portion thereof by first machining the cavity on one surface and machining the cavity on the other surface once again. In this case, the cavity 111 may be formed by the laser machining using the internal circuit layers 112 formed on both surfaces of the core 110 as the mask. That is, the cavity 111 is affected by the laser machining based on one end of the internal circuit layer 112 so that a point at which the cavity 111 starts may coincide with one end of the internal circuit layer 112.

Next, the side wall of the cavity 111 formed by the laser machining may be formed with a rough surface, that is, the roughness Ra by the mechanical machining of the sandblast and the chemical machining of the hydrofluoric acid treatment. Therefore, the inclined side wall of the cavity 111 is formed with the roughness and may alternately performed by a smear process and a desmear process. Further, the surfaces of the internal circuit layers 112 exposed on both surfaces of the core 110 may suffer from the surface treatment for ensuring adhesion. This is to ensure the adhesion between the insulating layers and the internal circuit layers 112 stacked on both surfaces of the core 110 is reliably formed.

Figure 2E:
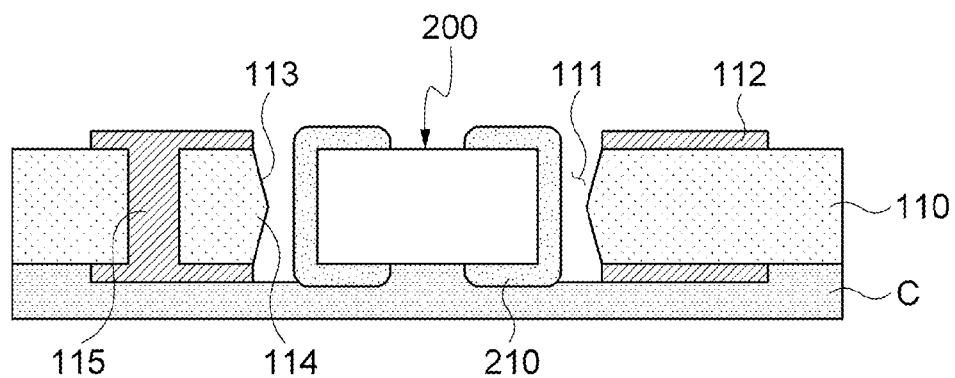

Next, as illustrated in FIG. 2E, an adhesive film C is attached to one surface of the core 110 and the electronic component 200 is embedded in the cavity 111. The electronic component 200 may be fixed on the adhesive film C and even though the electronic component 200 is biased to one side when being embedded in the cavity 111, both sides of the protruded part 114 formed by the inclined surface 113 formed on the side wall of the cavity 111 may contact the external electrodes 210, thereby preventing the short circuit between the internal circuit layer 112 and the external electrode 210 included in the electronic component 200.

Figure 2F:
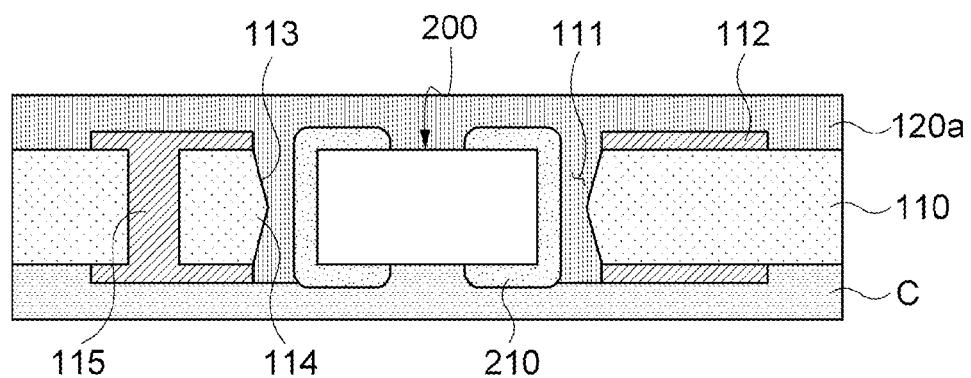

Next, as illustrated in FIG. 2F, the insulating material is stacked on an opposite surface of the core 110 to which the adhesive film C is attached to form an upper insulating layer 120a. As the upper insulating material forming the upper insulating layer 120a, insulating materials, such as prepreg, RCC, ABF, and the like, may be used. In this case, the insulating layer is stacked and then is heated and pressed to introduce the resin component included in the insulating material into the cavity 111, thereby fixing the electronic component 200. In this case, in order to prevent warpage of the board, it is preferable not to completely harden the insulating material.

Figure 2G:
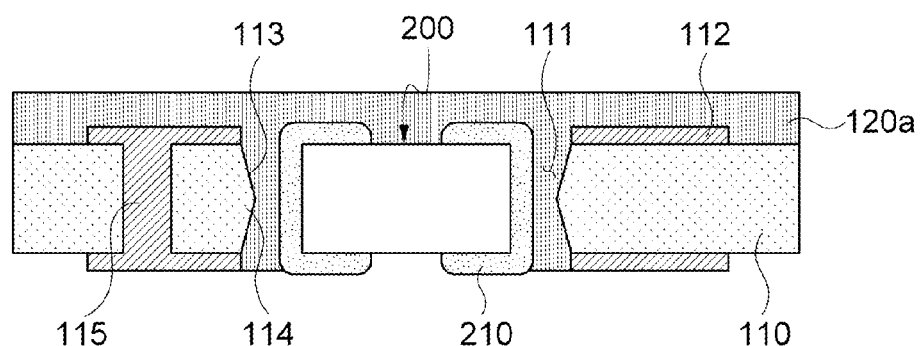
Figure 2H:
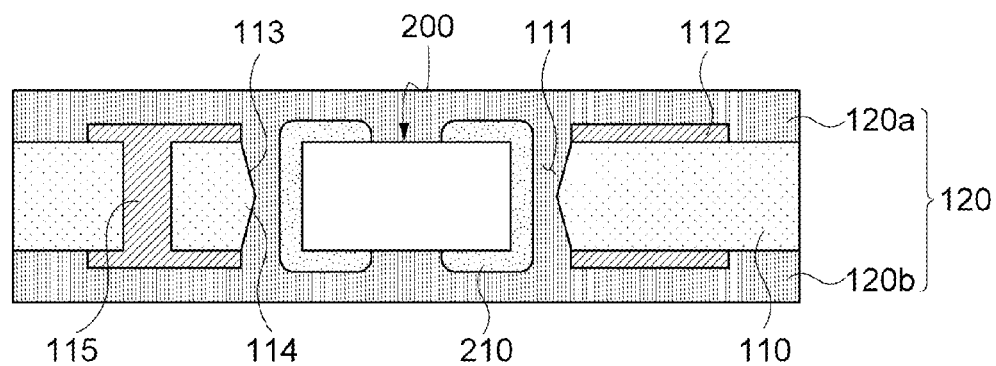

Further, as illustrated in FIGS. 2G and 2H, a lower insulating layer 120b is formed by removing the adhesive film C attached on one surface of the core 110 and applying the insulating material on the surface from which the adhesive film C is removed. The lower insulating layer 120b may be made of the same material as the insulating layer 120a and at the time of heating and pressing the lower insulating layer 120b, the insulating layers on the upper and lower portions of the core 110 may not be hardened completely.

Figure 2I:
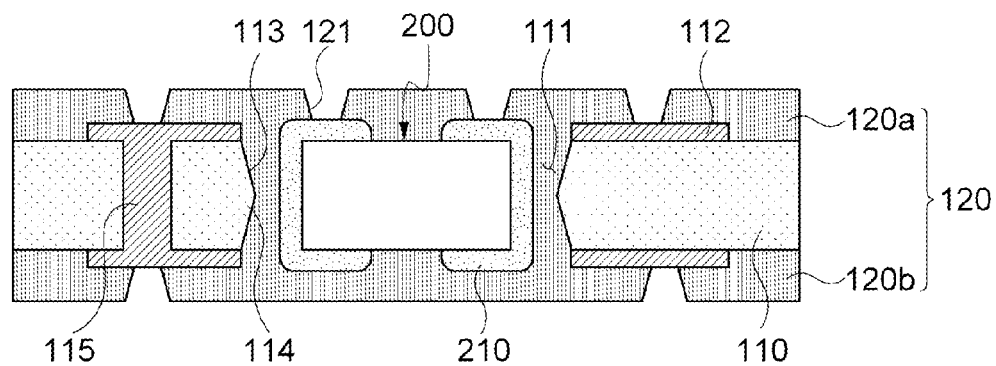
Figure 2J:
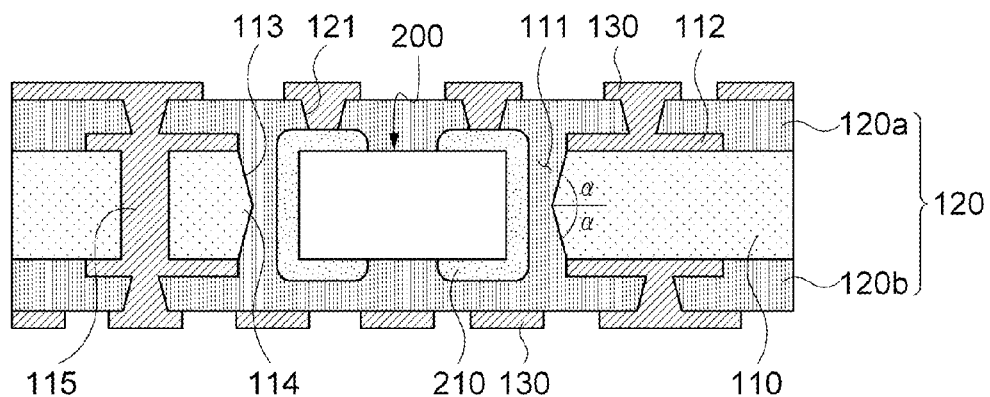

Next, as illustrated in FIG. 2I, the upper and lower insulating layers 120a and 120b formed on both surfaces of the core 110 suffer from the CNC drilling or the laser machining to form the via 121 and as illustrated in FIG. 2J, the plating layers covering the inside of the via and the surface of the insulating layer may be formed. The plating layer may be patterned by the tenting, MSAP, and SAP methods to be formed as the external circuit layer 130.

The process of FIGS. 2G to 2J may be repeated depending on the layer number of the printed circuit board to manufacture the printed circuit board having a desired layer number.

Experimental Example of Printed Circuit Board Including Electronic Component Embedded Therein In the printed circuit board including an electronic component embedded therein manufactured by the above-mentioned manufacturing method, the cavity is machined to form the inclined surface on the side wall thereof and the side wall of the inclined surface is formed with the roughness Ra by the sandblast machining and the hydrofluoric acid treatment. Under this condition, it can be appreciated from a result of testing the reliability of the printed circuit board 500 cycles and 1000 cycles when the resin component is laminated on the side wall within the cavity of 0.05 μm or less and 2 μm or more.

TABLE 1

| Roughness (Ra) | TC 500 cycle fail | TC 1,000 cycle fail |
| --- | --- | --- |
| <0.05 μm | 6/2880 ea | 21/2880 ea |
| 0.05-1 μm | 0/2880 ea | 0/2880 ea |
| 1-1.5 μm | 0/2880 ea | 0/2880 ea |
| 1.5-2 μm | 0/2880 ea | 0/2880 ea |
| 2-2.5 μm | 22/2880 ea | 61/2880 ea |
| >2.5 μm | 0/2880 ea | 75/2880 ea |

Further, when the insulating material having an ultra low CTE (CTE of 10 ppm/° C. or less) is used as the insulating layer, the inclined surface formed on the side wall of the cavity has a large effect on the flowability of the resin, such that the occurrence probability of defects may increase. When a material of which the CTE is 7 ppm/° C. is used as the insulating layer, it can be appreciated that the stacking is performed depending on the inclination of the side wall of the cavity and then the void defects occur as in the following Table 2.

TABLE 2

| Inclined degree of side wall of cavity | Presence and absence of void | Inclined degree of side wall of cavity | Presence and absence of void |
|---|---|---|---|
| >90° | ⊚ | 40°-50° | X |
| 80°-90° | ○ | 30°-40° | X |
| 70°-80° |  | 20°-30° |  |
| 60°-70° | X | <20° | ○ |
| 50°-60° | X |  |  |

Therefore, the inclined surface formed on the side wall of the cavity may be formed to have a range of the inclined degree that is smaller than 70° and larger than 30° to improve the flowability, thereby preventing voids from occurring.

As set forth above, according to the printed circuit board including an electronic component embedded therein and the method for manufacturing the same in accordance with the exemplary embodiments of the present invention, the bonding performance with the resin filled in the cavity can be improved by micro roughness that is formed on the inclined surface formed on the side wall of the cavity formed in the core, thereby preventing the lamination of the hardened insulating layer.

Further, according to the exemplary embodiments of the present invention, when the electronic component is embedded to be biased to one side within the cavity, one of the external electrodes of both sides of the electronic component can contact the corner of the protruded part formed on the side wall of the cavity, thereby preventing the external electrode from contacting the internal circuit layer formed on the core and fundamentally preventing the short circuit therebetween.

In addition, according to the exemplary embodiments of the present invention, when the resin included in the prepreg is introduced into the space between the cavity and the electronic component during the hardening of the insulating layers on the upper and lower portions of the core by the thermo-compression, the flowability of the resin within the core can be improved by introducing the resin along the inclined surface formed in the cavity, thereby preventing the voids from occurring.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A printed circuit board including an electronic component embedded therein, comprising:
a core formed with a cavity which is constituted with a through hole and is formed with an inclined surface such that a central portion of a sidewall is protruded;
an electronic component embedded in the cavity;
insulating layers stacked on upper and lower portions of the core including the electronic component; and
external circuit layers formed on the insulating layers.

2. The printed circuit board according to claim 1, wherein the core has the inclined surface in the core is formed with an acute angle on the upper portion and the lower portions thereof about the central portion thereof.

3. The printed circuit board according to claim 2, wherein the cavity is formed to have a width equal to or larger than that of the electronic component based on a corner of a protruded part formed at a central portion of the side wall.

4. The printed circuit board according to claim 1, wherein the core has internal circuit layers formed on upper and lower surfaces thereof, respectively, and one side of the internal circuit layer formed at an adjacent position to the cavity of the internal circuit layers coincides with a point at which an inclined surface of the cavity starts.

5. The printed circuit board according to claim 1, wherein an inclined surface of the cavity is formed with a micro roughness Ra ranging from 0.05 to 2 μm along the inclined surface thereof.

6. The printed circuit board according to claim 1, wherein the electronic component is an MLCC which includes external electrodes disposed at both sides thereof and a body disposed between the external electrodes.

7. The printed circuit board according to claim 6, wherein the insulating layer is further formed with a via through which the external circuit layers are electrically connected to the external electrodes.

8. The printed circuit board according to claim 1, wherein the insulating layer fills a space between the cavity and the electronic component.

9. The printed circuit board according to claim 5, wherein the inclined surface of the cavity is formed to have a range of an inclined degree that is smaller than 70° and larger than 30°.

10. The printed circuit board according to claim 1, wherein the cavity of the core has the inclined surface as the side wall, the inclined having an upper portion and a lower portion thereof formed symmetrically about the central portion.

* * * * *